(12) United States Patent
Earnshaw

(10) Patent No.: US 8,787,775 B2
(45) Date of Patent: Jul. 22, 2014

(54) OPTO-ELECTRONIC ASSEMBLY FOR A LINE CARD

(75) Inventor: Mark P. Earnshaw, Morristown, NJ (US)

(73) Assignee: Alcatel Lucent, Paris (FR)

( * ) Notice: Subject to any disclaimer, the term of this patent is extended or adjusted under 35 U.S.C. 154(b) by 539 days.

(21) Appl. No.: 12/944,875

(22) Filed: Nov. 12, 2010

(65) Prior Publication Data

US 2012/0087678 A1    Apr. 12, 2012

Related U.S. Application Data

(60) Provisional application No. 61/390,837, filed on Oct. 7, 2010, provisional application No. 61/390,876, filed on Oct. 7, 2010, provisional application No. 61/390,840, filed on Oct. 7, 2010, provisional application No. 61/390,798, filed on Oct. 7, 2010.

(51) Int. Cl.
*H04B 10/06* (2006.01)
(52) U.S. Cl.
USPC .......................................... 398/202; 398/212
(58) Field of Classification Search
USPC .......................................... 398/202; 385/14
See application file for complete search history.

(56) References Cited

U.S. PATENT DOCUMENTS

| | | | |
|---|---|---|---|
| 5,212,745 A | 5/1993 | Miller | |
| 6,034,799 A | 3/2000 | Hansen | |
| 6,315,462 B1 | 11/2001 | Anthamatten et al. | |
| 6,700,910 B1 | 3/2004 | Aoki et al. | |
| 6,909,536 B1 * | 6/2005 | Walker et al. | 359/337 |

(Continued)

FOREIGN PATENT DOCUMENTS

| | | |
|---|---|---|
| JP | 2002185069 A | 6/2002 |
| JP | 2004184663 A | 7/2004 |

(Continued)

OTHER PUBLICATIONS

International Search Report and Written Opinion; Mailed Jun. 28, 2012 for corresponding PCT Application No. PCT/US2011/053812.

(Continued)

*Primary Examiner* — Kenneth Vanderpuye
*Assistant Examiner* — Amritbir Sandhu
(74) *Attorney, Agent, or Firm* — Mendelsohn, Drucker & Dunleavy, P.C.

(57) ABSTRACT

In one embodiment, the opto-electronic assembly is a hybrid integrated circuit having an array of avalanche photodiodes (APDs) that are electrically coupled to a corresponding array of transimpedance amplifiers (TIAs), with both the APDs and TIAs being mounted on a common ceramic substrate. The opto-electronic assembly further has an optical subassembly comprising an arrayed waveguide grating (AWG) and an array of turning mirrors, both attached to a temperature-control unit in a side-by-side arrangement and flip-chip mounted on the substrate over the APDs. The opto-electronic assembly employs a silicon-based submount inserted between the APDs and the substrate to accommodate the height difference between the APDs and the TIAs. The submount advantageously enables the placement of APDs in relatively close proximity to the turning mirrors while providing good control of the APD's tilt and offset distance with respect to the substrate. The temperature-control unit enables independent temperature control of the AWG and of the array of turning mirrors, which helps to achieve good optical-coupling efficiency between the AWG and the APDs even when the turning mirrors have a relatively small size.

22 Claims, 3 Drawing Sheets

(56) References Cited

U.S. PATENT DOCUMENTS

| | | | |
|---|---|---|---|
| 7,021,840 B2 * | 4/2006 | Kuhara et al. | 385/92 |
| 7,035,505 B2 | 4/2006 | Shen et al. | |
| 7,067,854 B2 * | 6/2006 | Kuhara et al. | 257/186 |
| 7,136,595 B2 * | 11/2006 | Aoki et al. | 398/183 |
| 7,158,699 B2 | 1/2007 | Welch et al. | |
| 7,200,299 B1 * | 4/2007 | Earnshaw | 385/17 |
| 7,251,390 B2 * | 7/2007 | Fukai et al. | 385/14 |
| 7,338,637 B2 * | 3/2008 | Pease et al. | 422/68.1 |
| 7,379,633 B1 * | 5/2008 | Ashley et al. | 385/14 |
| 7,551,815 B2 * | 6/2009 | Welch et al. | 385/24 |
| 7,565,038 B2 | 7/2009 | Earnshaw | |
| 7,741,123 B2 * | 6/2010 | Pease et al. | 436/63 |
| 7,773,837 B2 * | 8/2010 | Welch et al. | 385/14 |
| 7,905,666 B2 * | 3/2011 | Terashima et al. | 385/93 |
| 7,937,000 B2 * | 5/2011 | Yokoyama | 398/213 |
| 8,548,333 B2 * | 10/2013 | Nagarajan et al. | 398/138 |
| 2002/0150323 A1 | 10/2002 | Nishida et al. | |
| 2002/0181519 A1 | 12/2002 | Vilhelmsson et al. | |
| 2002/0197010 A1 | 12/2002 | Kato et al. | |
| 2003/0081878 A1 | 5/2003 | Joyner et al. | |
| 2003/0095736 A1 * | 5/2003 | Kish et al. | 385/14 |
| 2004/0033004 A1 * | 2/2004 | Welch et al. | 385/14 |
| 2004/0071388 A1 * | 4/2004 | Benzoni et al. | 385/14 |
| 2004/0141691 A1 | 7/2004 | Wiesmann et al. | |
| 2005/0094927 A1 * | 5/2005 | Kish et al. | 385/14 |
| 2005/0100349 A1 * | 5/2005 | Kuhara et al. | 398/202 |
| 2005/0213883 A1 * | 9/2005 | Welch et al. | 385/37 |
| 2005/0213994 A1 * | 9/2005 | Dudek et al. | 398/202 |
| 2006/0280512 A1 | 12/2006 | Sato | |
| 2007/0053698 A1 * | 3/2007 | Margaritis | 398/202 |
| 2007/0172169 A1 * | 7/2007 | Kish et al. | 385/14 |
| 2008/0107429 A1 | 5/2008 | Galli et al. | |
| 2008/0112445 A1 | 5/2008 | Anselm | |
| 2008/0181557 A1 * | 7/2008 | Wang et al. | 385/14 |
| 2009/0022452 A1 * | 1/2009 | Welch et al. | 385/14 |
| 2009/0092357 A1 | 4/2009 | Ozawa et al. | |
| 2009/0214160 A1 | 8/2009 | Arol et al. | |
| 2010/0046065 A1 * | 2/2010 | Little et al. | 359/337.1 |
| 2010/0150569 A1 * | 6/2010 | Umnov et al. | 398/139 |
| 2010/0247021 A1 | 9/2010 | Cunningham et al. | |
| 2010/0247022 A1 | 9/2010 | Li et al. | |
| 2010/0247029 A1 | 9/2010 | Li et al. | |
| 2011/0026548 A1 | 2/2011 | Tamaya et al. | |
| 2011/0038631 A1 * | 2/2011 | Doerr | 398/65 |
| 2011/0103415 A1 | 5/2011 | Rasras | |
| 2011/0250725 A1 * | 10/2011 | Yeh et al. | 438/232 |
| 2011/0280512 A1 * | 11/2011 | Abe et al. | 385/14 |
| 2012/0087620 A1 * | 4/2012 | Pardo et al. | 385/14 |
| 2012/0087623 A1 * | 4/2012 | Neilson et al. | 385/24 |
| 2012/0194587 A1 * | 8/2012 | Teshigawara et al. | 347/12 |

FOREIGN PATENT DOCUMENTS

| | | |
|---|---|---|
| JP | 2005064109 A | 3/2005 |
| JP | 2007241211 A | 9/2007 |
| WO | WO2008043318 A1 | 4/2008 |
| WO | WO2009116134 A1 | 9/2009 |

OTHER PUBLICATIONS

M. G. Young, et al., "A 16 X 1 Wavelength Division Multiplexer with Integrated Distributed Bragg Reflector Lasers and Electroabsorption Modulators", IEEE Photonics Technology Letters, vol. 5, No. 8, Aug. 1993, pp. 908-910.

Yiu-Man Wong, et al., Technology Development of a High-Density 32-Channel 16-Gb/s Optical Data Link for Optical Interconnection Applications for the Optoelectronic Technology Consortium (OETC), J. of Lightwave Technology, vol. 13, No. 6, Jun. 1995, pp. 995-1016.

C. R. Doerr, et al, "Monolithic Silicon Coherent Receiver", 2009 OSA/OFC/NFPEC 2009, PDPB2.pdf (2009), 3 pgs.

D. T. Neilson et al, "Direct Laser Modulation", Filed on Jan. 31, 2011, U.S. Appl. No. 13/018,109.

Flavio Pardo, "Optical Transmitter With Flip-Chip Mounted Laser or Integrated Arrayed Waveguide Grating Wavelength Division Multiplexer", Filed on Nov. 12, 2010, U.S. Appl. No. 12/944,917.

D. T. Neilson et al, "Optical Assembly for a WDM Receiver or Transmitter", Filed on Nov. 12, 2010, U.S. Appl. No. 12/944,939.

D. Gill, "Wavelength Aligning Multi-Channel Optical Transmitters", Filed on Nov. 12, 2010, U.S. Appl. No. 12/945,550.

M. Rasras, "Thermally Controlled Semiconductor Optical Waveguide", Filed on Nov. 12, 2010, U.S. Appl. No. 12/944,946.

Notice of Reason for Refusal; Mailed Mar. 4, 2014 for the corresponding JP Application No. 2013-532839.

\* cited by examiner

100

OPTO-ELECTRONIC ASSEMBLY FOR A LINE CARD

CROSS-REFERENCE TO RELATED APPLICATIONS

This application claims priority from U.S. Provisional Patent Application Nos. 61/390,837, 61/390,876, 61/390,840, and 61/390,798 filed Oct. 7, 2010, all of which are incorporated herein by reference in their entirety.

U.S. patent application "OPTICAL ASSEMBLY FOR A WDM RECEIVER OR TRANSMITTER" by David Neilson, Nagesh Basavanhally, and Mark Earnshaw Ser. No. 12/944,939; U.S. patent application "DIRECT LASER MODULATION" by Pietro Bernasconi and David Neilson Ser. No. 12/945,429; U.S. patent application "OPTICAL TRANSMITTER WITH FLIP-CHIP MOUNTED LASER OR INTEGRATED ARRAYED WAVEGUIDE GRATING WAVELENGTH DIVISION MULTIPLEXER" by Mark Earnshaw and Flavio Pardo Ser. No. 12/944,917; U.S. patent application "THERMALLY CONTROLLED SEMICONDUCTOR OPTICAL WAVEGUIDE" by Mahmoud Rasras Ser. No. 12/944,946; and U.S. patent application "WAVELENGTH ALIGNING MULTI-CHANNEL OPTICAL TRANSMITTERS" by Douglas Gill Ser. No. 12/945,550, all filed on the same day as the present application, are all incorporated herein by reference in their entirety. One or more of the above-cited applications may describe optical receiver structures, optical transmitter structures, methods of making optical receiver and/or optical transmitter structures and/or methods of using optical receiver and/or transmitter components that may be suitable for making and/or using embodiments described herein.

BACKGROUND

1. Field of the Invention

The present invention relates to optical communication equipment and, more specifically but not exclusively, to line cards.

2. Description of the Related Art

This section introduces aspects that may help facilitate a better understanding of the invention(s). Accordingly, the statements of this section are to be read in this light and are not to be understood as admissions about what is in the prior art or what is not in the prior art.

An optical line card is used for interfacing optical communication lines, e.g., carrying optical signals to and from the subscribers, to the rest of the telecommunications access network. A typical optical line card is a modular opto-electronic circuit assembled on a printed circuit board. Its representative modules may include an optical transmitter, an optical receiver, an optical add/drop multiplexer, a digital signal processor, a controller, a power-management unit, a performance monitor, various optical and electrical interfaces, etc.

Different modules of an optical line card may be implemented using monolithic integration. A monolithic integrated circuit is usually fabricated on a single piece of semiconductor substrate, e.g., by (i) incorporating dopants into the substrate, (ii) depositing and patterning additional layers of material, and (iii) metallizing and packaging the resulting chip.

SUMMARY

A hybrid integrated circuit is a multi-component circuit constructed of multiple monolithic integrated circuits. For example, one circuit may include semiconductor and optical devices, and the other circuit may include one or more passive components, with both monolithic circuits being arranged over the same mechanical sub-mount. In the prior art, neither monolithic nor hybrid integration has allowed straightforward production of both the passive optical elements and the electro-optical elements of an optical transmitter or receiver.

Disclosed herein are various embodiments of an opto-electronic assembly that can be used in an optical receiver of a line card. In one embodiment, the opto-electronic assembly is a hybrid integrated circuit having an array of avalanche photodiodes (APDs) that are electrically coupled to a corresponding array of transimpedance amplifiers (TIAs), with both the APDs and TIAs being mounted on a common ceramic substrate. The opto-electronic assembly further has an optical subassembly comprising an arrayed waveguide grating (AWG) and an array of turning mirrors, both attached to a temperature-control unit in a side-by-side arrangement and flip-chip mounted on the substrate over the APDs. The opto-electronic assembly employs a silicon-based submount inserted between the APDs and the substrate to accommodate the height difference between the APDs and the TIAs. The submount advantageously enables the placement of APDs in relatively close proximity to the turning mirrors while providing good control of the APD's tilt and offset distance with respect to the substrate. The temperature-control unit enables independent temperature control of the AWG and of the array of turning mirrors, which helps to achieve good optical-coupling efficiency between the AWG and the APDs even when the turning mirrors have a relatively small size.

According to another embodiment, provided is an apparatus comprising: a support structure having a planar surface; a first planar substrate located at an offset distance from the planar surface and having a first optical device, the first optical device having an array of first optical ports along an edge of the first planar substrate; a second planar substrate located at an offset distance from the planar surface and having one or more second optical devices with second optical ports along a second edge of the second planar substrate, the second edge facing the first edge; a first heater thermally coupled to the first planar substrate; and a second heater thermally coupled to the second planar substrate. The first planar substrate has a substantially different thermal expansivity than the second planar substrate. The first heater and the second heater are configured to be separately controllable.

According to yet another embodiment, provided is an apparatus having a support plate, a plurality of photo-detectors mounted on the support plate, a plurality of amplifiers mounted on the support plate and electrically connected to receive electrical signals generated by the photo-detectors in response to received light, and an optical subassembly mounted on the support plate. The photo-detectors are positioned between the optical sub-assembly and the support plate. The optical subassembly is configured to direct light to the photo-detectors.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

Figure 1:
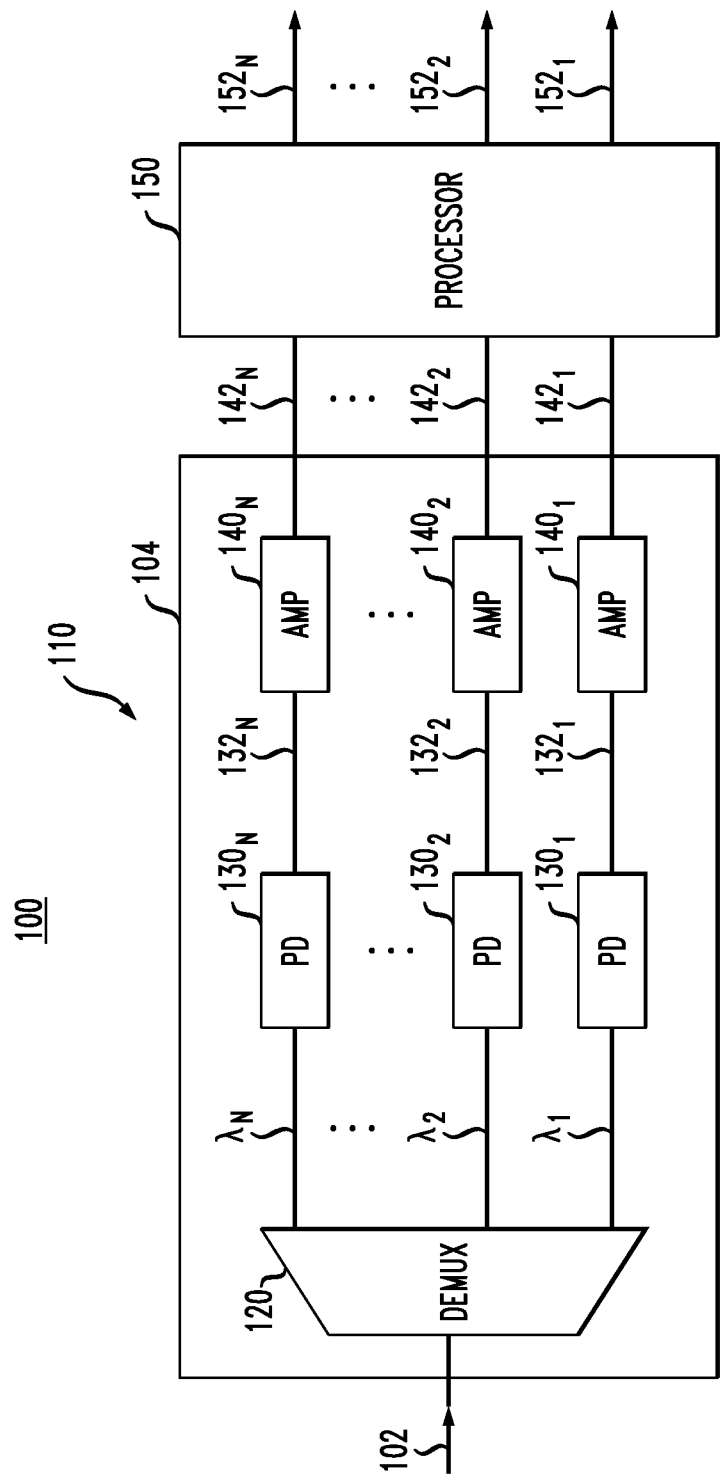
FIG. 1 shows a block diagram of an optical receiver according to one embodiment of the invention.

FIG. 1 shows a block diagram of an optical receiver 100 that can be used in an optical line card according to one embodiment of the invention. Receiver 100 has an optical-to-electrical (O/E) converter 110 and a signal processor 150. O/E converter 110 receives, e.g., from an external optical communications link, an N-component wavelength-division-multiplexed (WDM) signal 102 and transforms it into N electrical analog signals $142_1$-$142_N$ so that each signal 142 represents a corresponding WDM component of signal 102, where N is an integer greater than one. Processor 150 processes signals received on corresponding electrical lines $142_1$-$142_N$, as known in the art, to recover the data carried by the N individually modulated WDM components of signal 102 and outputs the recovered data via digital output signals $152_1$-$152_N$. The signal processing implemented in signal processor 150 includes analog-to-digital conversion and may optionally include one or more of clock recovery, electronic dispersion-compensation (EDC), and forward-error correction (FEC). In a representative embodiment, N=10, but, in other embodiments, can be as small or as large as needed for the particular application.

O/E converter 110 is a hybrid integrated circuit that can be implemented, e.g., as further described below in reference to FIG. 2. O/E converter 110 has an optical demultiplexer 120 that decomposes WDM signal 102 into its N constituent WDM components labeled $\lambda_1$-$\lambda_N$. Each WDM component $\lambda_i$ is applied to a respective one of photo-detectors (PDs) $130_1$-$130_N$. Each PD 130 converts the received WDM component into a corresponding one of electrical signals on lines $132_1$-$132_N$. Each electrical signal 132 is then amplified in a corresponding one of amplifiers $140_1$-$140_N$ to produce a corresponding one of electrical analog signals on electrical lines $142_1$-$142_N$.

In a representative embodiment, optical demultiplexer 120 is a monolithic integrated optical circuit, and each of PDs $130_1$-$130_N$ and amplifiers $140_1$-$140_N$ is an individual semiconductor device. PDs $130_1$-$130_N$ may be spatially arranged in any desired manner, e.g., in a linear array, as indicated in FIG. 1. Demultiplexer 120, PD devices $130_1$-$130_N$, and amplifier devices $140_1$-$140_N$ are mounted on or over a planar surface of a (common) support plate 104, for example, made of a ceramic, composite, or polymeric material. Support plate 104 can be used to attach O/E converter 110, either directly or via additional structural elements, to a printed circuit board of the corresponding optical line card.

Figure 2:
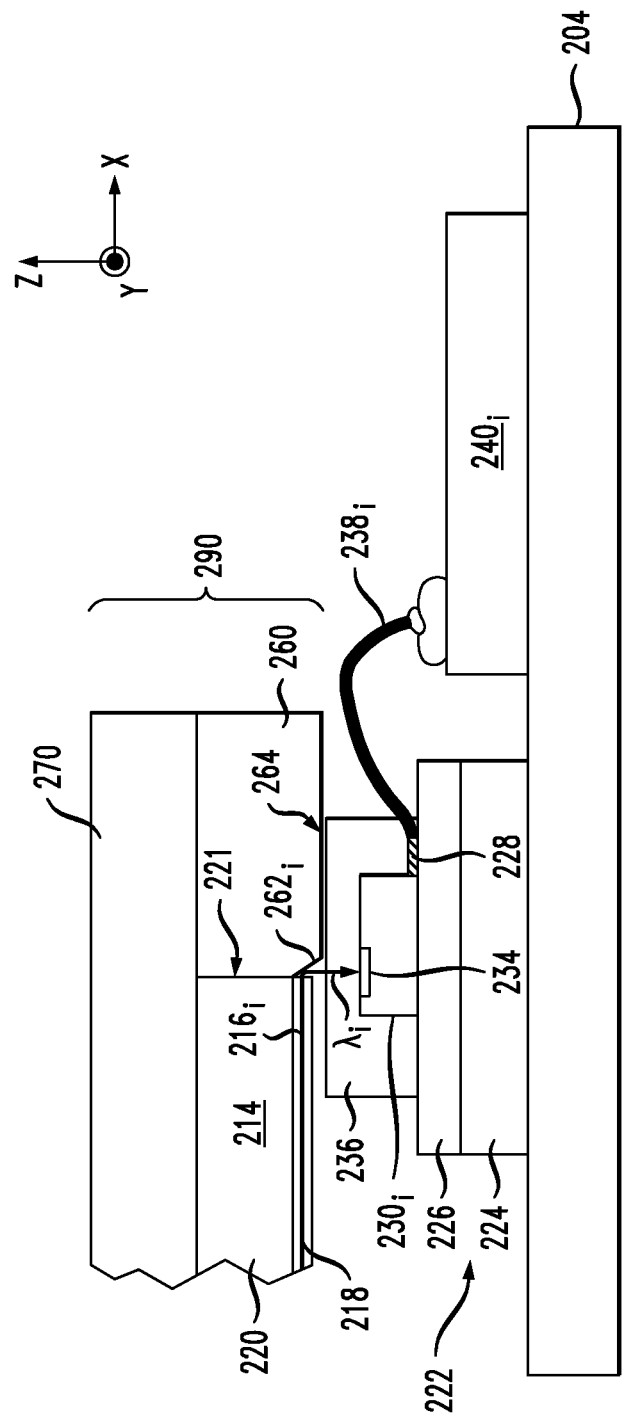
FIG. 2 shows a partial cross-sectional side view of an opto-electronic assembly that can be used in the optical receiver of FIG. 1 according to one embodiment of the invention.

FIG. 2 shows a partial side view of a cross-section of an opto-electronic assembly 200 that can be used in O/E converter 110 according to one embodiment of the invention. Opto-electronic assembly 200 has, e.g., a ceramic substrate (support plate) 204 that provides structural support for other components of the assembly. Substrate 204 can be one of possible implementations of support plate 104. Directly mounted on substrate 204 are a plurality of transimpedance amplifiers (TIAs) $240_1$-$240_N$ arranged in a linear lateral array. This linear lateral array arrangement causes only one of TIAs $240_1$-$240_N$, i.e., TIA $240_i$, to be visible in the view of FIG. 2. TIA $240_i$ is electrically connected to receive signals from an avalanche photodiode (APD) $230_i$ via a wire lead $238_i$. Similar to TIA $240_i$, APD $230_i$ is part of a plurality of APDs $230_1$-$230_N$ arranged in a linear-lateral array, which causes only APD $230_i$ to be visible in FIG. 2.

APDs $230_1$-$230_N$ are mounted on a submount 222 that is attached to substrate 204. Submount 222 serves at least two different functions and may comprise, e.g., a base layer 224, an isolation layer 226, and a conducting layer 228.

In some embodiments, a first function of submount 222 is to reduce optical losses by accommodating the height difference between APDs $230_1$-$230_N$ and TIAs $240_1$-$240_N$. Herein, the term height refers to the thickness of the corresponding piece or component along the Z axis (as represented in FIG. 2). Typically, an APD (such as APD $230_i$) has a smaller height than a TIA (such as TIA $240_i$). If APD $230_i$ were to be mounted directly on substrate 204, then a photosensitive area 234 of the APD would be located at a relatively large distance from an optical subassembly 290 (which projects light onto the photosensitive area) because TIA $240_i$ and wire lead $238_i$ would prevent the optical subassembly from being positioned any closer to the APD than the highest point of the TIA and/or the wire lead. Disadvantageously, this relatively large distance could cause a relatively high optical loss or could require the incorporation of one or more additional optical elements, such as a lens. Submount 222 can address this problem by enabling a significant reduction in the distance between photosensitive area 234 and optical subassembly 290. For that reason, in some embodiments, the optical loss can be kept to an acceptably low level without the incorporation of additional optical elements into assembly 200.

In some embodiments, a second function of submount 222 is to provide good control of height and tilt across the array of APDs $230_1$-$230_N$. For example, if substrate 204 is a ceramic carrier, a relatively large (e.g., N>5) linear APD array may require the ceramic carrier to have a relatively large size and/or large aspect ratio, e.g., 1 cm×1 mm. Large aspect ratios, such as this one, can reduce the fabrication yield due to the brittle nature of ceramics. Also, the thermal treatment that ceramic materials undergo during fabrication often causes a relatively large shrinkage of the material so that the surface of the resulting ceramic carrier becomes somewhat "wavy." Disadvantageously, this type of a mounting surface may cause unacceptable height and tilt variations among the APDs of the APD array. In assembly 200, this problem can be addressed by using a non-ceramic material for submount 222, which can enable the surface of the submount to be sufficiently flat to meet relatively tight specifications with respect to the height uniformity and tilt in the positioning of APDs $230_1$-$230_N$.

In one embodiment, base layer 224 of submount 222 is made of silicon, and isolation layer 226 of the submount is made of silicon oxide or silicon nitride. Since the silicon-processing technology is mature and well developed, the flatness of external surfaces of submount 222 can often be well controlled, e.g., to within ±2 μm, so that the specifications with respect to the height uniformity and tilt in the positioning of APDs $230_1$-$230_N$ are easily met. Isolation layer 226 serves as an electrically non-conducting spacer between APD $230_i$ and silicon base layer 224 and may be sufficiently thick to be able to inhibit the generation of radio-frequency (RF)-induced parasitic currents in the silicon base layer when the APD receives a modulated optical signal and generates a corresponding electrical RF signal for TIA $240_i$. A typical thickness of isolation layer 226 is between about 10 μm and about 30 μm. Isolation layer 226 can also enable convenient deposition, patterning, and soldering of conducting layer 228 to provide appropriate electrical connections between APDs 230 and the corresponding wire leads 238.

Optical subassembly 290 is mounted on substrate 204 using two spacers 236 positioned at the two (Y-axis) ends of the optical subassembly so as to form a Π-shaped structure, with the spacers being the two legs of the Π and the optical subassembly being the top horizontal bar of the Π. In the view shown in FIG. 2, only one of the two spacers 236 is visible, i.e., the spacer connected to the distal end of optical subassembly 290. In various embodiments, spacers 236 may be attached directly to substrate 204 or to submount 222. The height of spacers 236 and the thickness of submount 222 are selected so as to make the air gap between the lower surface of optical subassembly 290 and the upper surface of photosensitive area 234 as small as practically possible (to keep optical losses low) while providing sufficient clearance with appropriate tolerances for APDs 230 and wire leads 238.

Optical subassembly 290 comprises an arrayed waveguide-grating device (AWGD) 220, a planar structure 260 having an array of mirrors 262 on a surface thereof, and a temperature-control unit 270. AWGD 220 serves as a WDM wavelength demultiplexer (also see demultiplexer 120 in FIG. 1) and is a monolithic planar integrated circuit having a substrate layer 214 and a waveguide layer 218. AWGD 220 is oriented so that optical waveguide layer 218 has a smaller offset distance with respect to substrate 204 than substrate layer 214. Optical waveguide layer 218 has the various optical waveguides that implement the optical-grating functionality of AWGD 220. An input WDM signal (such as optical signal 102, FIG. 1) is applied to an input waveguide (not explicitly shown in FIG. 2). AWGD 220 decomposes the input WDM signal into its N constituent WDM components and directs each WDM component into a respective one of N output waveguides $216_1$ to $216_N$ in layer 218. For example, WDM component $\lambda_i$ is directed into output waveguide $216_i$, as indicated in FIG. 2.

An edge 221 of AWGD 220, which has the termini of output waveguides $216_1$ to $216_N$, faces mirror array 260 so that each output waveguide is optically coupled to a corresponding one of N mirrors 262. Each mirror 262 serves as a turning mirror that redirects light coming out of output waveguides 216 along the X axis to propagate along the Z axis toward APDs 230. For example, mirror $262_i$, which receives WDM component $\lambda_i$ from output waveguide $216_i$, redirects that WDM component toward photosensitive area 234 of APD $230_i$, as indicated in FIG. 2.

In one embodiment, mirror array 260 is a substantially rectangular piece of glass or silicon having one of its edges polished off to form a slanted surface that is oriented at a non-90-degree angle with respect to the two adjacent surfaces. The slanted surface may have a thin metal layer deposited over it to form a reflective surface of mirrors $262_1$ to $262_N$. The thickness of the glass piece and the width of the slanted surface are selected so that the cores of output waveguides 216 are aligned with a middle portion of the slanted surface. As a result, mirror array 260 may be slightly thicker than AWGD 220, which helps to accommodate the expansion of the optical beams in the free space between the termini of output waveguides 216 and the slanted surface of the mirror array. In one configuration, spacers 236 are attached to a surface 264 of mirror array 260 that faces substrate 204. Since surface 264 has a smaller offset distance from substrate 204 than the outer surface (i.e., the lower surface in the view shown in FIG. 2) of optical waveguide layer 218 in AWG 220, there is a small gap between spacer 236 and the optical waveguide layer. Other spacer configurations are also possible.

In an alternative embodiment, mirror array 260 can be any suitable array of micromirrors, including possible implementations as a MEMS device.

Both mirror array 260 and AWGD 220 are attached to temperature-control unit 270, which can serve at least two functions. First, temperature-control unit 270 may serve as a structural base for optical subassembly 290 that enables appropriate positioning of AWGD 220 and mirror array 260 with respect to one another for flip-chip mounting over APDs $230_1$-$230_N$. Second, temperature-control unit 270 controls the temperature(s) of AWGD 220 and mirror array 260. For example, temperature-control unit 270 may incorporate one or more temperature sensors and one or more resistive heaters (not explicitly shown in FIG. 2) to maintain the temperature of AWGD 220 to within ±1 K of a specified temperature. As known in the art, spectral transmission characteristics of an AWGD, such as AWGD 220, are relatively sensitive to temperature, and good temperature control can ensure that the AWGD has relatively low optical-insertion losses at the ITU wavelengths $\lambda_i$.

In one configuration, temperature-control unit 270 delivers, using different resistive heaters, different respective rates of heat flow to AWGD 220 and mirror array 260, e.g., to avoid detrimental temperature gradients and/or to keep the AWG and mirror array at different respective temperatures. This feature can be used, e.g., to enable implementations in which AWGD 220 and mirror array 260 are made of different materials, thereby enabling the use of low-cost materials, e.g., for the mirror array, without the detriment of increased optical losses. In addition, possible optical misalignments induced by non-uniform heating induced by external heat sources (such as electronic circuits located in relatively close proximity to optical subassembly 290) can be mitigated or avoided.

Figure 3:
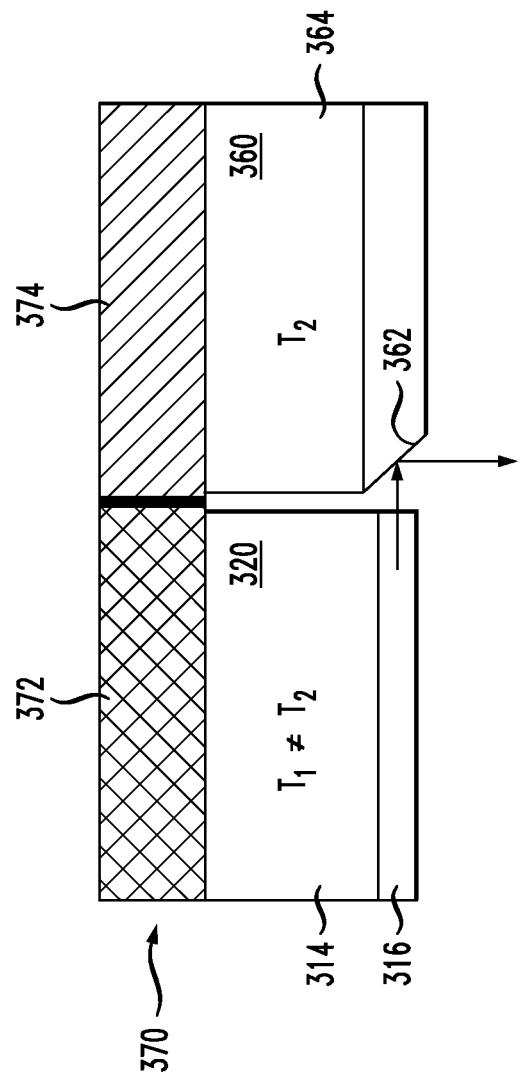
FIG. 3 shows a cross-sectional side view of an optical subassembly that can be used in the opto-electronic assembly of FIG. 2 according to one embodiment of the invention.

FIG. 3 shows a cross-sectional side view of an optical subassembly 390 that can be used as optical subassembly 290 according to one embodiment of the invention. Optical subassembly 390 comprises an AWGD 320, a planar structure 360 having an array of mirrors 362 on a surface thereof, and a temperature-control unit 370. Each mirror 362 has a relatively small vertical size, which is only slightly larger than the thickness of output waveguides 316 in AWGD 320. The small vertical size may be advantageous for enabling the middle portion of mirror 362 to be positioned (i) in relatively close proximity to the terminus of output waveguide 316 and/or (ii) in relatively close proximity to photosensitive area 234 (see FIG. 2). Planar structure 360 and AWGD 320 are implemented using different respective sets of materials. For example, AWGD 320 may have a planar substrate 314 made of a first material (e.g., silicon), and planar structure 360 may have a planar substrate 364 made of a second material (e.g., glass) different from the first material. As a result, planar structure 360 and AWGD 320 have different thermal expansion coefficients.

In general, different instances of AWGD 320 have different optimal operating temperatures due to process variations during fabrication. As a result, different instances of optical subassembly 390 may need to be configured to keep their respective AWGDs 320 at different respective operating temperatures. While planar structure 360 is designed to have a thickness that places the middle portion of mirrors 362 in optical alignment with output waveguides 316 at the nominal operating temperature, a difference in the thermal expansion coefficients and a deviation of the actual operating temperature from the nominal operating temperature may cause mirrors 362 to go out of good optical alignment with output waveguides 316 in some instances of optical subassembly 390 if planar structure 360 has the same temperature as AWGD 320.

To address this problem, temperature-control unit 370 has two independently controlled heaters 372 and 374. Heater 372 provides temperature control for AWGD 320 and is configured to keep the AWGD at the appropriate operating temperature, $T_1$, selected so that the optical insertion losses in the AWGD are kept close to a minimum. As already indicated above, temperature $T_1$ may differ from the nominal operating temperature. Heater 374 provides independent temperature control for planar structure 360 and is configured to keep the planar structure at temperature $T_2$, which may differ from temperature $T_1$. More specifically, temperature $T_2$ is selected so that, if necessary, the difference in the thermal expansion coefficients for AWGD 320 and planar structure 360 is properly compensated by the difference between temperatures $T_1$ and $T_2$. Due to this compensation, mirrors 362 and output waveguides 316 are placed in good optical alignment with each other, thereby enabling optical subassembly 390 to have a relatively high optical throughput (or low optical losses) despite the deviation of temperature $T_1$ from the nominal operating temperature.

In one embodiment, different mirrors 362 of planar structure 360 are implemented as different (e.g., separate) optical devices integrated into planar structure 360, with planar structure 360 having a corresponding plurality of optical ports along its edge to enable optical coupling between the output ports of AWGD 320 (e.g., the termini of output waveguides 316) and the corresponding mirrors 362.

As used herein, the term "offset distance" refers to a minimum distance between two elements. For example, in the view shown in FIG. 2, the offset distance between substrate 204 and mirror array 260 is the distance between the upper surface of the substrate and the lower surface of the mirror array. Similarly, the offset distance between substrate 204 and AWGD 220 is the distance between the upper surface of the substrate and the lower surface of the AWGD. Therefore, the offset distance between AWGD 220 and substrate 204 is greater than the offset distance between mirror array 260 and substrate 204.

While this invention has been described with reference to illustrative embodiments, this description is not intended to be construed in a limiting sense. For example, although TIA 240₂ has been described as being directly attached to substrate 204, an alternative embodiment that uses a submount inserted between the TIA and the substrate is also possible. TIAs 240 connected to different APDs 230 may be arranged in a staggered rather than linear configuration. More specifically, in the view shown in FIG. 2, the staggered configuration means that TIA $240_i$ is located to the right of APD $230_i$ (as shown), whereas TIA $240_{i+1}$ is located to the left of APD $230_{i+1}$, with this alternation being repeated across the TIA array. Planar substrate 314 may primarily be formed of a first semiconductor, and planar substrate 364 may primarily be formed of a second semiconductor, e.g., having a different alloy composition than the first semiconductor.

Various modifications of the described embodiments, as well as other embodiments of the invention, which are apparent to persons skilled in the art to which the invention pertains are deemed to lie within the principle and scope of the invention as expressed in the following claims.

For the purposes of this specification, a MEMS device is a device having two or more parts adapted to move relative to one another, where the motion is based on any suitable interaction or combination of interactions, such as mechanical, thermal, electrical, magnetic, optical, and/or chemical interactions. MEMS devices are fabricated using micro- or smaller fabrication techniques (including nano-fabrication techniques) that may include, but are not necessarily limited to: (1) self-assembly techniques employing, e.g., self-assembling monolayers, chemical coatings having high affinity to a desired chemical substance, and production and saturation of dangling chemical bonds and (2) wafer/material processing techniques employing, e.g., lithography, chemical vapor deposition, patterning and selective etching of materials, and treating, shaping, plating, and texturing of surfaces. Examples of MEMS devices include, without limitation, NEMS (nano-electromechanical systems) devices, MOEMS (micro-opto-electromechanical systems) devices, micromachines, microsystems, and devices produced using microsystems technology or microsystems integration.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The use of terms such as height, length, width, top, bottom, is strictly to facilitate the description of the invention and is not intended to limit the invention to a specific orientation. For example, height does not imply only a vertical rise limitation, but is used to identify one of the three dimensions of a three-dimensional structure as shown in the figures. Such "height" would be vertical where the electrodes are horizontal but would be horizontal where the electrodes are vertical, and so on. Similarly, while all figures show the different layers as horizontal layers such orientation is for descriptive purposes only and not to be construed as a limitation.

The functions of the various elements shown in the figures, including any functional blocks labeled as "processors," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

What is claimed is:

1. An apparatus, comprising:
   a support structure having a planar surface;
   a first planar substrate located at an offset distance from the planar surface and having a first optical device, the first optical device having an array of first optical ports along an edge of the first planar substrate;
   a second planar substrate located at an offset distance from the planar surface and having one or more second optical devices with second optical ports along a second edge of the second planar substrate, the second edge facing the first edge;
   a first heater thermally coupled to the first planar substrate; and
   a second heater thermally coupled to the second planar substrate, wherein:
      the first planar substrate has a substantially different thermal expansivity than the second planar substrate; and
      the first heater and the second heater are configured to be separately controllable.

2. The apparatus of claim 1, wherein the first planar substrate includes a planar base, the optical device is located adjacent to the planar base, and the planar base has a different composition than a composition of the second planar substrate.

3. The apparatus of claim 1, wherein one of the first planar substrate and the second planar substrate is primarily formed of a semiconductor and other of the first planar substrate and the second planar substrate is primarily formed of a dielectric.

4. The apparatus of claim 1, wherein one of the first planar substrate and the second planar substrate is primarily formed of a first semiconductor and the other of the first planar substrate and the second planar substrate is primarily formed of a second semiconductor having a different alloy composition.

5. The apparatus of claim 1, wherein the one or more second optical devices optically couple to devices located on the planar surface of the support structure.

6. The apparatus of claim 1, further comprising a controller being connected to separately operate the first and second heaters, wherein:
   the first optical device is an AWG device; and
   each second optical device is a mirror.

7. The apparatus of claim 1, further comprising:
   a plurality of photo-detectors mounted on the planar surface; and
   a plurality of amplifiers mounted on the planar surface and electrically connected to receive electrical signals generated by the photo-detectors in response to received light, wherein the one or more second optical devices are configured to direct light from the array of first optical ports to the plurality of photo-detectors.

8. The apparatus of claim 7, further comprising a submount attached to the planar surface, wherein the photo-detectors are mounted on the submount.

9. The apparatus of claim 8, wherein the submount comprises:
   a first layer attached to the planar surface; and
   a second layer formed over the first layer, wherein the photo-detectors are directly attached to the second layer.

10. The apparatus of claim 9, wherein:
    the first layer comprises silicon;
    the second layer comprises silicon oxide or silicon nitride and has a thickness of at least about 10 μm;
    the submount further comprises a third layer formed over the second layer and made of an electrically conductive material; and
    the third layer is patterned to form electrical leads for transmitting the electrical signals from the photo-detectors to the amplifiers.

11. An apparatus, comprising:
    a support plate;
    a plurality of photo-detectors mounted on the support plate;
    a plurality of amplifiers mounted on the support plate and electrically connected to receive electrical signals generated by the photo-detectors in response to received light;
    an optical subassembly mounted on the support plate, wherein:
       the photo-detectors are positioned between the optical sub-assembly and the support plate; and
       the optical subassembly is configured to direct light to the photo-detectors; and
    a first spacer and a second spacer, both mounted on the support plate, wherein:
       a first end of the optical subassembly is attached to the first spacer;
       a second end of the optical subassembly is attached to the second spacer; and
       a middle portion of the optical subassembly is suspended between the first and second spacers; and
    a submount attached to the support plate, wherein:
       the photo-detectors are mounted on the submount; and
       the first and second spacers are attached to the submount.

12. The apparatus of claim 11, wherein:
    the photo-detectors are mounted at a first offset distance from the support plate;
    the amplifiers are mounted at a second offset distance from the support plate; and
    the first offset distance is larger than the second offset distance.

13. The apparatus of claim 12, wherein the amplifiers are directly attached to the support plate.

14. The apparatus of claim 11, wherein:
    the photo-detectors are mounted on the submount; and
    the submount comprises:
       a first layer directly attached to the support plate; and
       a second layer formed over the first layer, wherein the photo-detectors are directly attached to the second layer.

15. The apparatus of claim 14, wherein:
    the first layer comprises silicon;
    the second layer comprises silicon oxide or silicon nitride and has a thickness of at least about 10 μm;

the submount further comprises a third layer formed over the second layer and made of an electrically conductive material;

the third layer is patterned to form electrical leads for transmitting the electrical signals from the photo-detectors to the amplifiers; and a surface of the submount on which the photo-diodes are mounted is flat to within about ±2 µm.

16. The apparatus of claim 11, wherein the optical subassembly comprises:

an optical demultiplexer adapted to demultiplex an optical signal into a plurality of spectral components; and one or more mirrors configured to receive the spectral components from the optical demultiplexer and direct said spectral components to the corresponding photo-detectors.

17. The apparatus of claim 16, wherein:

the optical subassembly further comprises a temperature-control unit;

the optical demultiplexer and the one or more mirrors are both attached to the temperature-control unit in a side-by-side arrangement;

the temperature-control unit is positioned at a greater offset distance from the support plate than either of the optical demultiplexer and the array of mirrors; and the temperature-control unit comprises two or more resistive heaters adapted to separately control the temperature of the optical demultiplexer and the one or more mirrors.

18. The apparatus of claim 17, wherein the optical demultiplexer is positioned at a greater offset distance from the support plate than the one or more mirrors.

19. The apparatus of claim 11, further comprising a signal processor configured to:

receive amplified electrical signals produced by the amplifiers by amplifying the electrical signals generated by the photo-detectors; and process the amplified electrical signals to recover data carried by the light received by the photo-detectors from the optical subassembly, wherein the apparatus is an optical receiver in an optical line card.

20. An apparatus, comprising:

a support plate;

a plurality of photo-detectors mounted on the support plate;

a plurality of amplifiers mounted on the support plate and electrically connected to receive electrical signals generated by the photo-detectors in response to received light; and an optical subassembly mounted on the support plate, wherein:

the photo-detectors are positioned between the optical sub-assembly and the support plate; and the optical subassembly is configured to direct light to the photo-detectors; and a submount directly attached to the support plate, wherein:

the photo-detectors are mounted on the submount; and the submount comprises:

a first layer directly attached to the support plate;

a second layer formed over the first layer, wherein the photo-detectors are directly attached to the second layer; and a third layer formed over the second layer and made of an electrically conductive material, wherein:

the first layer comprises silicon;

the second layer comprises silicon oxide or silicon nitride and has a thickness of at least about 10 µm;

the third layer is patterned to form electrical leads for transmitting the electrical signals from the photo-detectors to the amplifiers; and a surface of the submount on which the photo-diodes are mounted is flat to within about ±2 µm.

21. An apparatus, comprising:

a support plate;

a plurality of photo-detectors mounted on the support plate;

a plurality of amplifiers mounted on the support plate and electrically connected to receive electrical signals generated by the photo-detectors in response to received light; and an optical subassembly mounted on the support plate, wherein:

the photo-detectors are positioned between the optical sub-assembly and the support plate;

the optical subassembly is configured to direct light to the photo-detectors;

the optical subassembly comprises:

an optical demultiplexer adapted to demultiplex an optical signal into a plurality of spectral components;

one or more mirrors configured to receive the spectral components from the optical demultiplexer and direct said spectral components to the corresponding photo-detectors; and a temperature-control unit;

the optical demultiplexer and the one or more mirrors are both attached to the temperature-control unit in a side-by-side arrangement;

the temperature-control unit is positioned at a greater offset distance from the support plate than either of the optical demultiplexer and the array of mirrors; and the temperature-control unit comprises two or more resistive heaters adapted to separately control the temperature of the optical demultiplexer and the one or more mirrors.

22. The apparatus of claim 21, wherein the optical demultiplexer is positioned at a greater offset distance from the support plate than the one or more mirrors.

* * * * *